United States Patent [19]
Ueno et al.

[11] Patent Number: 5,929,688
[45] Date of Patent: Jul. 27, 1999

[54] LEVEL CONVERTER

[75] Inventors: Masaji Ueno; Yasukazu Noine, both of Kanagawa-ken, Japan

[73] Assignee: Kabushiki Kaisha Toshiba, Kawasaki, Japan

[21] Appl. No.: 08/982,286

[22] Filed: Dec. 1, 1997

[30] Foreign Application Priority Data

Nov. 29, 1996 [JP] Japan .................................. 8-319440

[51] Int. Cl.⁶ .............................................. H03L 5/00
[52] U.S. Cl. ........................................... 327/333; 327/387
[58] Field of Search ............................... 326/27, 28, 63, 326/80, 81; 327/215, 198, 226, 333, 379, 384, 387, 389, 391, 544

[56] References Cited

U.S. PATENT DOCUMENTS

| | | | |
|---|---|---|---|
| 4,230,951 | 10/1980 | Suzuki | 307/200 B |
| 4,616,148 | 10/1986 | Ochii et al. | 307/530 |
| 4,978,870 | 12/1990 | Chen et al. | 307/475 |
| 5,079,439 | 1/1992 | Wanlass | 307/246 |
| 5,483,179 | 1/1996 | Dhong | 326/88 |
| 5,583,460 | 12/1996 | Dohi | 327/126 |

FOREIGN PATENT DOCUMENTS

| | | | |
|---|---|---|---|
| 406152356 | 5/1994 | Japan | 327/389 |

*Primary Examiner*—Timothy P. Callahan
*Assistant Examiner*—Maria Hasanzadah
*Attorney, Agent, or Firm*—Oblon, Spivak, McClelland, Maier & Neustadt, P.C.

[57] ABSTRACT

A CMOS level converter including two CMOS inverter that are complimentary coupled with each other. Each of the CMOS inverter includes two MOS transistors and is coupled between a source voltage and a ground potential in series. When an input signal begins to change from a low level to a high level, one of the MOS transistors in an input side CMOS inverter is turned off, and the inverter is coupled through a diode to the ground potential. As the input level rises gradually, on the input side inverter, due to a high level output from an output side inverter, the MOS transistor turns on. As a consequent, the output is set at the ground potential in the level conversion, even when the amplitude is insufficient.

18 Claims, 9 Drawing Sheets

LEVEL CONVERTER

BACKGROUND OF THE INVENTION

1. Field of the Invention

The present invention relates to a level converter, and in particular to a level converter for an inverter. More particularly, the present invention relates to a level converter for a CMOS inverter that can sufficiently raise an insufficient amplitude input signal to a prescribed amplitude of the signal for the inverter.

2. Discussion of Background

A CMOS inverter is usually made by coupling a p-channel MOS transistor or an n-channel MOS transistor such as shown in FIG. 6. This circuit operates as an inverter during an ON state of either one of the two CMOS inverters P10 and N10. However, such a CMOS inverter has problems and defects. In particular, a problem exists concerning a pass through current that flows from the power source Vcc to the ground GND due to a phenomenon that both of the CMOS transistors P10 and N10 are in an ON state at the same time. Such a phenomenon occurs when the ON state of either one of the two CMOS transistors is changed to the OFF state, or vice-versa, due to supplying an input signal with an insufficient amplitude. This phenomenon frequently occurs due to a structure of a preceding stage to the input of the inverter.

For instance, as shown in FIG. 6, assume that a high level of the CMOS inverter is 5 V as a power source Vcc, and a low level of the inverter is 0 V as a ground GND. In addition, assume a gate-source operational threshold voltage Vthn of the n-channel MOS transistor N10 is approximately 0.8 V.

In such an operational condition for the CMOS inverter, assume an input signal with an insufficient amplitude of a voltage is supplied to the inverter. As shown in FIG. 6, the input signal has reached only 4 V as the high level and 1 V as the low level. If one of the CMOS transistors begins to operate under these insufficient conditions, the input level of the inverter can only reach 1 V. Further, the gate-source voltage VGS of the n-channel MOS transistor N10 becomes 1 V (i.e., 1 V–GND (0 V)). Accordingly, the gate-source voltage VGS becomes higher than the gate-source operational threshold voltage Vthn of 0.8 V. When the n-channel MOS transistor N10 is in the ON state, the p-channel MOS transistor P10 is also in an ON state, since the input level of the p-channel MOS transistor P10 is also at a naturally low level. Therefore, since both of the CMOS transistors are in the ON state at the same time, a pass through current flows through the inverter in the direction from the power source Vcc to the GND. Similarly, the pass through current flows when the input level of the inverter changes from the low level to the high level.

To prevent an occurrence of the pass through current, a level converter for the inverter has been proposed. As illustrated in FIG. 7, a conventional level converter for the inverter includes an inverter INV-A1 and two diodes D1 and D2 that are respectively coupled to the respective sides of the power source and the ground for the inverter INV-A1. In addition, a positive feedback circuit including inverters INV-B1 and INV-C1 is connected to the output of the inverter INV-A1.

In the level converter shown in FIG. 7, by means of a forward voltage of the diode (hereinafter referred to as VF), the inverter INV-A1 provides a high level output signal of (Vcc-VF) and a low level output signal of (GND+VF) when an input signal (in) is supplied. The circuit including the two inverters INV-B1 and INV-C1 converts the output signal of the inverter INV-A1 to the high level of the source voltage Vcc or the low level of the ground voltage GND by a toggle operation of the positive feedback circuit.

FIG. 8 explains the operation of the conventional level converter. Assume that, as explained in FIG. 6, the input signal to the inverter INV-A1 only reaches the low level of 1 V. Supposing that a drop of the forward voltage of the diode D2 is about 0.7 V, the gate-source voltage VGS of the n-channel MOS transistor N11 becomes about 0.3 V (i.e., 1V–0.7- GND (0)). Since the gate-source voltage VGS of the n-channel MOS transistor N11 becomes lower than the gate-source operational threshold voltage Vthn of 0.8 V, the n-channel transistor N11 is in an OFF state. At this time, the p-channel MOS transistor P11 is in an ON state, since the low level signal is supplied to the input (in). Consequently, the occurrence of the pass through current through the inverter INV-A1 is prevented. Similarly, when the high level input is supplied, the occurrence of the pass through current through the inverter INV-A1 is also prevented or suppressed.

In addition, by means of the positive feedback circuit including the inverters INV-B1 and INV-C1, the insufficient low level output of 0.7 V from the inverter INV-A1 is converted to the sufficient low level of 0 V. Similarly, when an insufficient high level of the input signal is supplied to the inverter INV-A1, the output is converted to the sufficient high level of the power source voltage Vcc (5 V).

As mentioned above, the occurrence of the pass through current through the inverter INV-A1 is prevented and a sufficient amplitude of an appropriate amplitude range is accomplished in the conventional level converter shown in FIG. 7. However, a defect exists because a pass through current is generated during the level transition from a high level to a low level, or vice versa. That is, when the level transition occurs, an output short circuit occurs between the inverter INV-A1 and the inverter INV-C1 as shown in FIG. 7 by a dotted line. Accordingly, it is still impossible to avoid wasting current through the inverter.

FIGS. 9A and 9B explain an operation of the level converter shown in FIG. 8 for the case of the level transition discussed above. As shown in FIG. 9A, the input level (in) to the inverter INV-A1 transfers from a high level of Vcc-VF to a low level of VF. Namely, the input level of the inverter INV-A1 is at the high level (Vcc-VF) at an initial state. In this state, an output level of the inverter INV-A1, an input level of the inverter INV-B1, and an output level of the inverter INV-C1 are equally at a low level (GND). Further, both the output of the inverter INV-B1 and the input of the inverter INV-C1 are kept at the high level of Vcc at the initial state.

The input (in) level starts to transfer at time t1, and when it falls to ½ Vcc at time t2, the output of the inverter INV-A1 (A1 out) rises and a level begins to invert. When the output (A1 out) of the inverter INV-A1 reaches ½ Vcc at time t3, the output of the inverter INV-B1 begins to invert. When the output of the inverter INV-B1 falls to a prescribed level at time t4, the inverter INV-C1 begins to invert. Next, when the input (in) reaches VF at time t5, the output of inverter INV-B1 reaches the low level (GND) at time t6 due to the positive feedback function.

In other words, when the input (in) of the inverter INV-A1 changes from a high level to a low level, so that the output rises from a low level to a high level, a pass through current is generated in the inverter INV-B1, and its output is supplied to the inverter INV-C1. Due to this, in the inverter INV-C1, both a p-channel and an n-channel MOS transistor become conductive.

Consequently, as indicated by the dotted lines in FIG. 8, a pass through current flows from the power source to the ground GND through the p-channel MOS transistor in the inverter INV-C1 and the diode D2. The condition of the pass through current is hereinafter referred to as "pass through mode".

FIG. 9B illustrates a current waveform due to the pass through mode. The output of the inverter INV-A1 moves towards the high level, and its output collides with the output of inverter INV-C1 due to the pass through mode. In this way, the output of the inverter INV-A1 and the output of the inverter INV-C1 collide with each other. Consequently, a power is wasted due to a wasteful current during the pass through mode. It also affects the output level, so that an appropriate CMOS level cannot be realized.

In order to eliminate the wasteful current by preventing the occurrence of the pass through mode, it is necessary to set a lower driving power of the inverter INV-C1 on the feedback side. However, when this setting is made, the timing for reaching the full output of the amplitude becomes slower.

As explained above, the conventional level converter has problems when the input level transfer from a high level to a low level. That is, current is wasted due to the pass through mode in a positive feedback circuit.

Also, as explained in FIG. 6, the conventional inverter has a defect of a "pass through current" that flows from the power source to the ground when the input changes from an ON state to an OFF state or vice versa, which causes both channel MOS transistors P10 and N10 to be in an ON state.

SUMMARY OF THE INVENTION

Accordingly, it is an object of the present invention to solve the aforementioned problems and defects of the conventional level converter and to provide a level converter that can reduce wasteful electric power consumption due to unnecessary current use.

It is another object of the present invention to provide a level converter that can perform a quick switching operation.

It is a further object of the present invention to provide a stable operating level converter regardless of a fluctuation in characteristics caused by variation in the devices.

It is a still further object of the present invention to provide a stable level converter by adopting a construction of two complementary inverters.

It is a still further object of the present invention to provide a level converter that converts insufficient input signals to reach a prescribed level of the CMOS level.

It is a still further object of the present invention to provide a level converter that can reduce an influence of varying the temperature characteristics of a clipping element for a CMOS level of the preceding stage by arranging compressing elements at the input side of the level converter.

These and other objects are achieved according to the present invention by providing a level converter having a first inverter for providing an inverted output signal from a non-inverted input signal, a second inverter for providing a non-inverted output signal from an inverted input signal, a first gate unit coupled to the first inverter between a power source and a ground potential in series, the first gate is controlled by the output of the second inverter, a first directional bypass unit coupled to the first inverter between the power source and the ground potential in series for bypassing the first gate unit, a second gate unit coupled to the second inverter between the power source and the ground potential in series, the second gate is controlled by the output of the first inverter, and a second directional bypass unit coupled to the second inverter between the power source and the ground potential in series for bypassing the second gate unit.

Furthermore, the present invention is characterized in that the first and second directional bypass units in the level converter includes a plurality of diodes and a plurality of bipolar transistors or MOS transistors.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
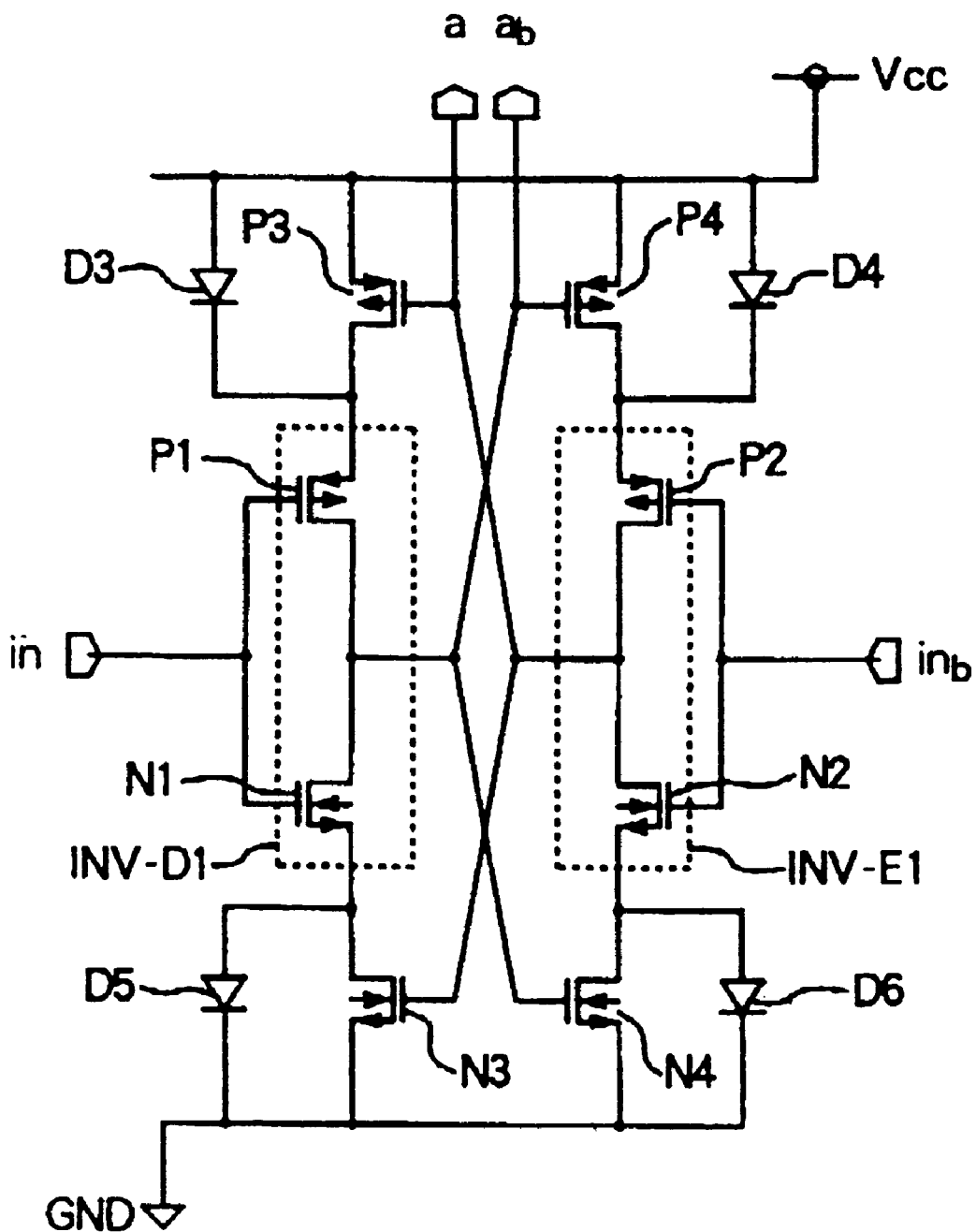
FIG. 1 is a circuit diagram illustrating the construction of a first embodiment of the level converter according to the present invention.

Referring now to drawings, wherein like reference numerals designate identical or corresponding parts through the several views, and more particularly to FIG. 1 thereof, there is illustrated a circuit diagram of a first embodiment of a level converter according to the present invention.

As shown in FIG. 1, a level converter according to the present invention includes a complementary circuit having a first inverter INV-D1 and a second inverter INV-E1. The first inverter INV-D1 includes a first CMOS transistor having a first p-channel MOS transistor P1 and a first n-channel MOS transistor N1. The second inverter INV-E1 includes a second CMOS transistor having a second p-channel MOS transistor P2 and a second n-channel MOS transistor N2.

The first p-channel MOS transistor P1 of the first inverter INV-D1 is coupled in series to a first diode D3 and a third p-channel MOS transistor P3. Both the first diode D3 and the third p-channel MOS transistor P3 are coupled to a power source Vcc.

On the other hand, the first n-channel MOS transistor N1 of the first inverter INV-D1 is coupled in series to a second diode D5 and a second n-channel MOS transistor N3. Further, the second diode D5 and the fourth n-channel MOS transistor N3 are coupled to a ground potential GND.

A non-inverted input signal is supplied to an input (in) of the first inverter INV-D1. The second inverter INV-E1 includes a second CMOS transistor having a third p-channel MOS transistor P2 and a third n-channel MOS transistor N2. The second p-channel MOS transistor P2 of the second inverter INV-E1 is coupled in parallel to a fourth diode D6 and a fourth n-channel MOS transistor N4. Both the fourth diode D6 and the fourth n-channel MOS transistor N4 are commonly coupled to the ground potential GND. An inverted input signal is supplied to an input (inb) of the second inverter INV-E1. Hereinafter, the subscript "b" indicates the inversion of the signal.

An output signal (ab) from the first inverter INV-D1 is commonly coupled to both gates of the fourth p-channel MOS transistor P4 and the fourth n-channel MOS transistor N4 on the second inverter INV-E1 side. Similarly, an output signal (a) from the second inverter INV-E1 is coupled to both gates of the third p-channel MOS transistor P3 and the third n-channel MOS transistor N3 on the first inverter INV-D1 side. As discussed above, the present invention provides a complementary level converter.

Figure 2:
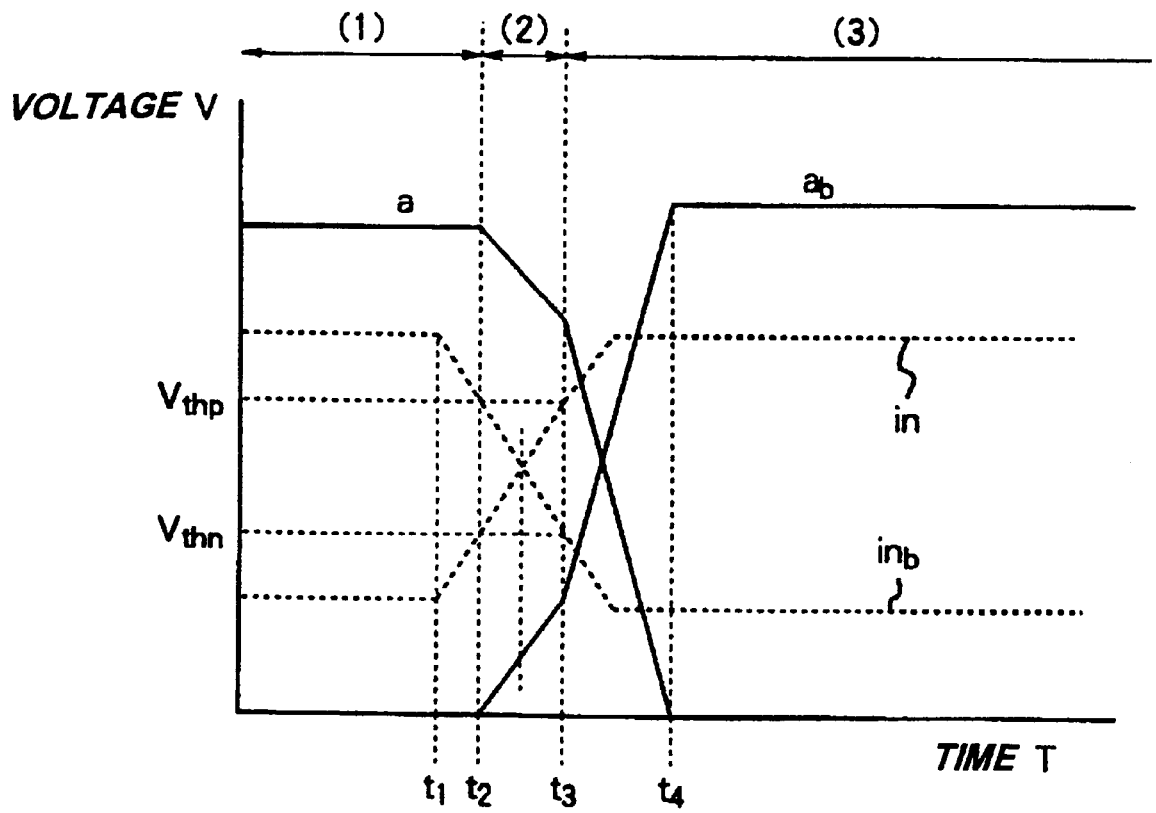
FIG. 2 is a diagram for explaining the operation of the level converter of the present invention shown in FIG. 1.

Next, an operation of the complementary level converter will be explained with reference to FIG. 2. FIG. 2 explains an initial state(1), a transition state (2) and an inverted state (3), respectively.

(1) Initial state:

First, a low level signal is input to the non-inverted input (in) of the first inverter INV-D1, and a high level signal is input to the inverted input (inb) of the second inverter INV-E1. In this case, in the first inverter INV-D1, the n-channel MOS transistor N1 is in an OFF state and the p-channel MOS transistor P1 is in an ON state. Then the output (ab) from the first inverter INV-D1 is at a high level. Since the output (ab) is also supplied to the gates of the fourth p-channel MOS transistor P4 and the fourth n-channel MOS transistor N4 on the second inverter INV-E1 side, the fourth p-channel MOS transistor P4 is in an OFF state, while the fourth n-channel MOS transistor N4 is in an ON state.

In the same way, in the second inverter INV-E1, the second n-channel MOS transistor N2 is in an ON state and the second p-channel MOS transistor P2 is in an OFF state, and the second inverter INV-E1 has a low level output (a). Since the output signal (a) is also supplied to the gates of the third p-channel MOS transistor P3 and the third n-channel MOS transistor N3 on the first inverter INV-D1 side, the p-channel MOS transistor P3 is in an ON state, while the n-channel MOS transistor N3 is in an OFF state.

Here, since a high level signal is supplied to the inverting input (in) of the first inverter INV-D1, a high level signal is provided from the output (a) of the first inverter INV-D1. In this case, since the third p-channel MOS transistor P3 is in an ON state, the output (ab) is converted to the power source level Vcc even when the input signal (in) does not have a sufficient amplitude.

On the other hand, for the second inverter INV-E1, as the inverting input (inb) is at a high level, the low level signal is provided as output (a). In this case, since the fourth n-channel MOS transistor N4 is in an ON state, the output (a) is converted to the GND level even when the input (inb) does not have a sufficient amplitude.

(2) Transition state:

The voltage level of the input (in) begins to change from a low level to a high level at time t1. In the first inverter INV-D1, the input voltage (in) gradually rises and exceeds a threshold voltage Vthn of the first n-channel MOS transistor N1 at time t2. In this case, although the first n-channel MOS transistor N1 is in an ON state, the first p-channel MOS transistor P1 remains in an ON state because the first p-channel MOS transistor P1 does not yet exceed its threshold voltage Vthp. Consequently, a route for passing the through current is formed. However, in this process, as the third n-channel MOS transistor N3 remains in an OFF state, the first inverter INV-D1 is coupled to the ground potential GND through the second diode D5. Accordingly, the threshold voltage Vthp of the first p-channel MOS transistor P1 is restricted by the forward voltage VF of the second diode D5.

On the other hand, for the second inverter INV-E1, the input voltage (inb) gradually decreases, and the gate-source voltage VGS of the second p-channel MOS transistor P2 is lower than the threshold voltage Vthp at time t2. In this case, the second p-channel MOS transistor P2 is in an ON state. Since the second n-channel MOS transistor N2 does not exceed the threshold voltage Vthp of the third n-channel MOS transistor N3, it remains in an ON state and forms a route for the pass through current. However, since the fourth p-channel MOS transistor P4 remains in an OFF state, the second inverter INV-E1 is coupled to the power source Vcc through the third diode D4. Accordingly, the threshold voltage Vthn of the second p-channel MOS transistor P2 is restricted by the forward voltage VF of the third diode D4.

(3) Inverted state:

Furthermore, as the input voltage (in) rises gradually, the gate-source voltage VGS of the first p-channel MOS transistor P1 is lower than the threshold voltage Vthp of the first p-channel MOS transistor N1 at time t3. In this case, in the first inverter INV-D1, the first p-channel MOS transistor P1 is in an OFF state, and the first n-channel MOS transistor N1 remains in an ON state. Consequently, the output (ab) of the first inverter INV-D1 is at a low level.

On the other hand, the voltage of input (inb) also decreases gradually. At time t3, it is lower than threshold voltage Vthn. In this case, in the second inverter INV-E1, the second n-channel MOS transistor N2 is in an OFF state, while the second p-channel MOS transistor P2 remains in an ON state. Consequently, the second inverter INV-E1 has a high level output (a).

As a result, on the first inverter INV-D1 side, due to the high level output (a) of the second inverter INV-E1, the third n-channel MOS transistor N3 is in an ON state, and the output (ab) is converted to the ground potential GND, even when the input level does not have a sufficient amplitude. Further, since the third p-channel MOS transistor P3 is in an OFF state and the first diode D3 is coupled to the source voltage Vcc in series through the first inverter INV-D1, the pass through current is prevented due to the forward voltage VF of the diode.

In the same way, on the second inverter INV-E1 side, due to the low level output (ab) of the first inverter INV-D1, the second p-channel MOS transistor P4 is in an ON state, and the output (a) is converted to the level of power source Vcc, even when the input level does not have a sufficient amplitude. Also, since the fourth n-channel MOS transistor N4 is in an OFF state and the fourth diode D6 is coupled to the ground potential GND through the second inverter INV-E1, there is little chance for the pass through current to occur due to the forward voltage VF of the diode.

Figure 3:
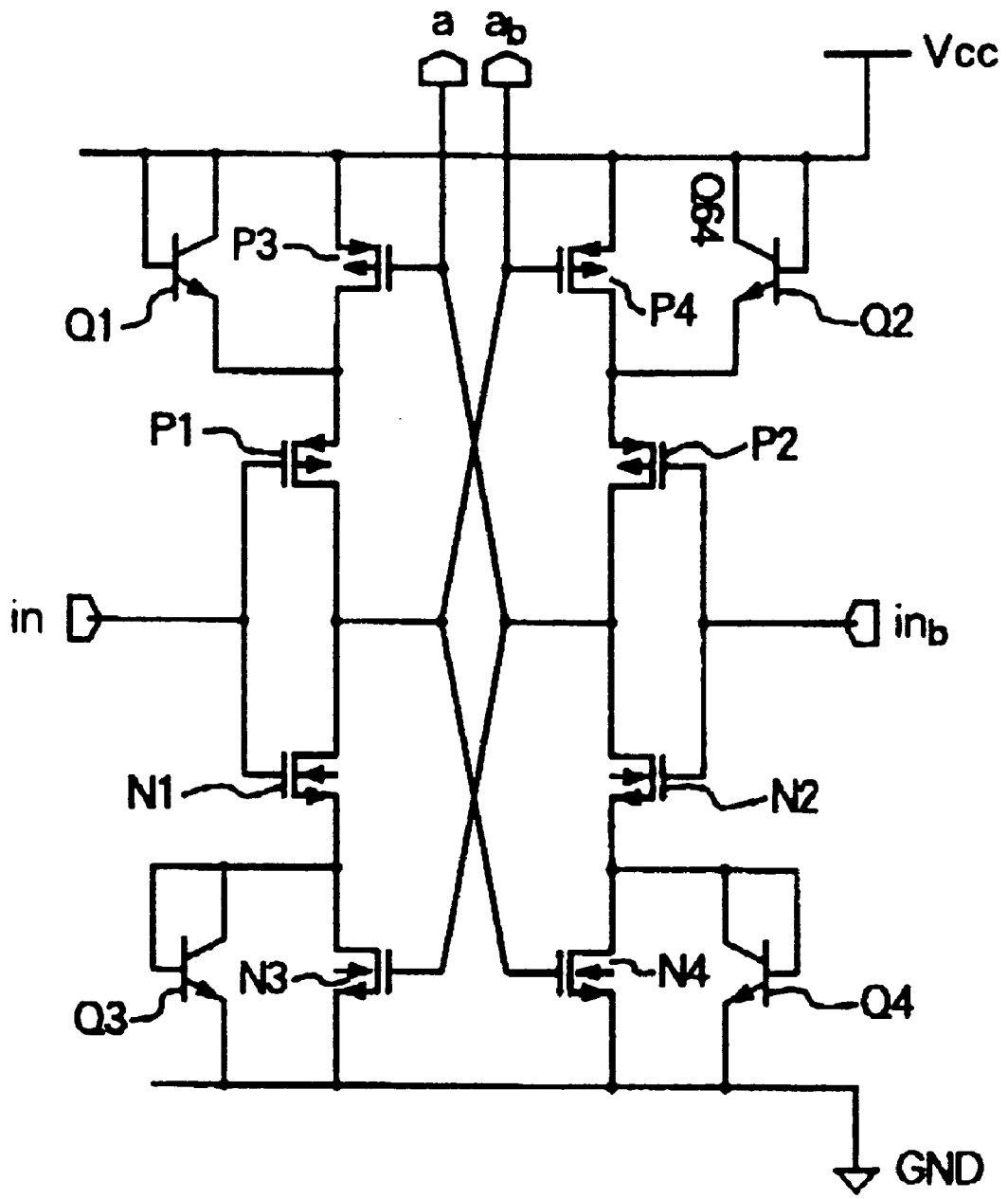
FIG. 3 is a circuit diagram illustrating the construction of a second embodiment of the level converter according to the present invention.

FIG. 3 is a circuit diagram illustrating a second embodiment of the level converter according to the present invention. In this embodiment, a plurality of bipolar transistors Q1–Q4 are used in place of the plurality of diodes D3–D6 in the first embodiment of the present invention shown in FIG. 1. The basic operation of this second embodiment is the same as that in the first embodiment shown in FIG. 1.

(1) Initial state:

As explained above, first, a low level signal is input to the non-inverted input (in) of the first inverter INV-D1, and a high level signal is input to the inverted input (inb) of the second inverter INV-E1. In this case, in the first inverter INV-D1, the n-channel MOS transistor N1 is in an OFF state and the p-channel MOS transistor P1 is in an ON state. Then, the output (ab) from the first inverter INV-D1 is at a high level. Since the output (ab) is also supplied to the gates of the fourth p-channel MOS transistor P4 and the fourth n-channel MOS transistor N4 on the second inverter INV-E1 side, the fourth p-channel MOS transistor P4 is in an OFF state, while the fourth n-channel MOS transistor N4 is in an ON state.

In the same way, in the second inverter INV-E1, the second n-channel MOS transistor N2 is in an ON state and the second p-channel MOS transistor P2 is in an OFF state, and the second inverter INV-E1 has a low level output (a). Since the output signal (a) is also supplied to the gates of the third p-channel MOS transistor P3 and the third n-channel MOS transistor N3 on the first inverter INV-D1 side, the p-channel MOS transistor P3 is in an ON state, while the n-channel MOS transistor N3 is in an OFF state.

Here, since a high level signal is supplied to the inverting input (in) of the first inverter INV-D1, a high level signal is provided from the output (a) of the first inverter INV-D1. In this case, since the third p-channel MOS transistor P3 is in an ON state, the output (ab) is converted to the power source level Vcc, even when the input signal (in) does not have a sufficient amplitude.

On the other hand, for the second inverter INV-E1, as the inverting input (inb) is at a high level, the low level signal is provided as output (a). In this case, since the forth n-channel MOS transistor N4 is in an ON state, the output (a) is converted to the GND level, even when the input (inb) does not have a sufficient amplitude.

(2) Transition state:

The voltage level of the input (in) begins to change from a low level to a high level at time t1. In the first inverter INV-D1, the input voltage (in) gradually rises and exceeds a threshold voltage Vthn of the first n-channel MOS transistor N1 at time t2. In this case, although the first n-channel MOS transistor N1 is in an ON state, the first p-channel MOS transistor P1 remains in an ON state because the first p-channel MOS transistor P1 does not yet exceed its threshold voltage Vthp. Consequently, a route for passing the through current is formed. However, in this process, as the third n-channel MOS transistor N3 remains in an OFF state, the first inverter INV-D1 is coupled to the ground potential GND through the second diode D5. Accordingly, the threshold voltage Vthp of the first p-channel MOS transistor P1 is restricted by the forward voltage VF of the second bipolar transistor Q2.

On the other hand, for the second inverter INV-E1, the input voltage (inb) gradually decreases, and the gate-source voltage VGS of the second p-channel MOS transistor P2 is lower than the threshold voltage Vthp at time t2. In this case, the second p-channel MOS transistor P2 is in an ON state. Since the second n-channel MOS transistor N2 does not exceed the threshold voltage Vthp of the third n-channel MOS transistor N3, it remains in an ON state forming a route for the pass through current. However, since the fourth p-channel MOS transistor P4 remains in an OFF state, the second inverter INV-E1 is coupled to the power source Vcc through the third diode D4. Accordingly, the threshold voltage Vthn of the second p-channel MOS transistor P2 is restricted by the forward voltage VF of the third bipolar transistors Q2.

(3) Inverted state:

Furthermore, as the input voltage (in) rises gradually, the gate-source voltage VGS of the first p-channel MOS transistor P1 is lower than the threshold voltage Vthp of the first p-channel MOS transistor N1 at time t3. In this case, in the first inverter INV-D1, the first p-channel MOS transistor P1 is in an OFF state, and the first n-channel MOS transistor N1 remains in an ON state. Consequently, the output (ab) of the first inverter INV-D2 is at a low level.

On the other hand, the voltage of input (inb) also decreases gradually. At time t3, it is lower than threshold voltage Vthn. In this case, in the second inverter INV-E1, the second n-channel MOS transistor N2 is in an OFF state, while the second p-channel MOS transistor P2 remains in an ON state. Consequently, the output (a) of the second inverter INV-E1 is at a high level.

As a result, on the first inverter INV-D1 side, due to the high level output (a) of the second inverter INV-E1, the third n-channel MOS transistor N3 is in an ON state, and the output (ab) is converted to the ground potential GND, even when the input level does not have a sufficient amplitude.

Further, since the third p-channel MOS transistor P3 is in an OFF state and the first bipolar transistors Q1 is coupled to the source voltage Vcc in series through the first inverter INV-D1, the pass through current is prevented due to the forward voltage VF of the bipolar transistors.

In the same way, on the second inverter INV-E1 side, due to the low level output (ab) of the first inverter INV-D1, the second p-channel MOS transistor P4 is in an ON state, and the output (a) is converted to the level of power source Vcc, even when the input level does not have a sufficient amplitude. Also, since the fourth n-channel MOS transistor N4 is in an OFF state and the fourth bipolar transistors Q4 is coupled to the ground potential GND through the second inverter INV-E1, there is little chance for the pass through current to occur due to the forward voltage VF of the bipolar transistors.

Figure 4:
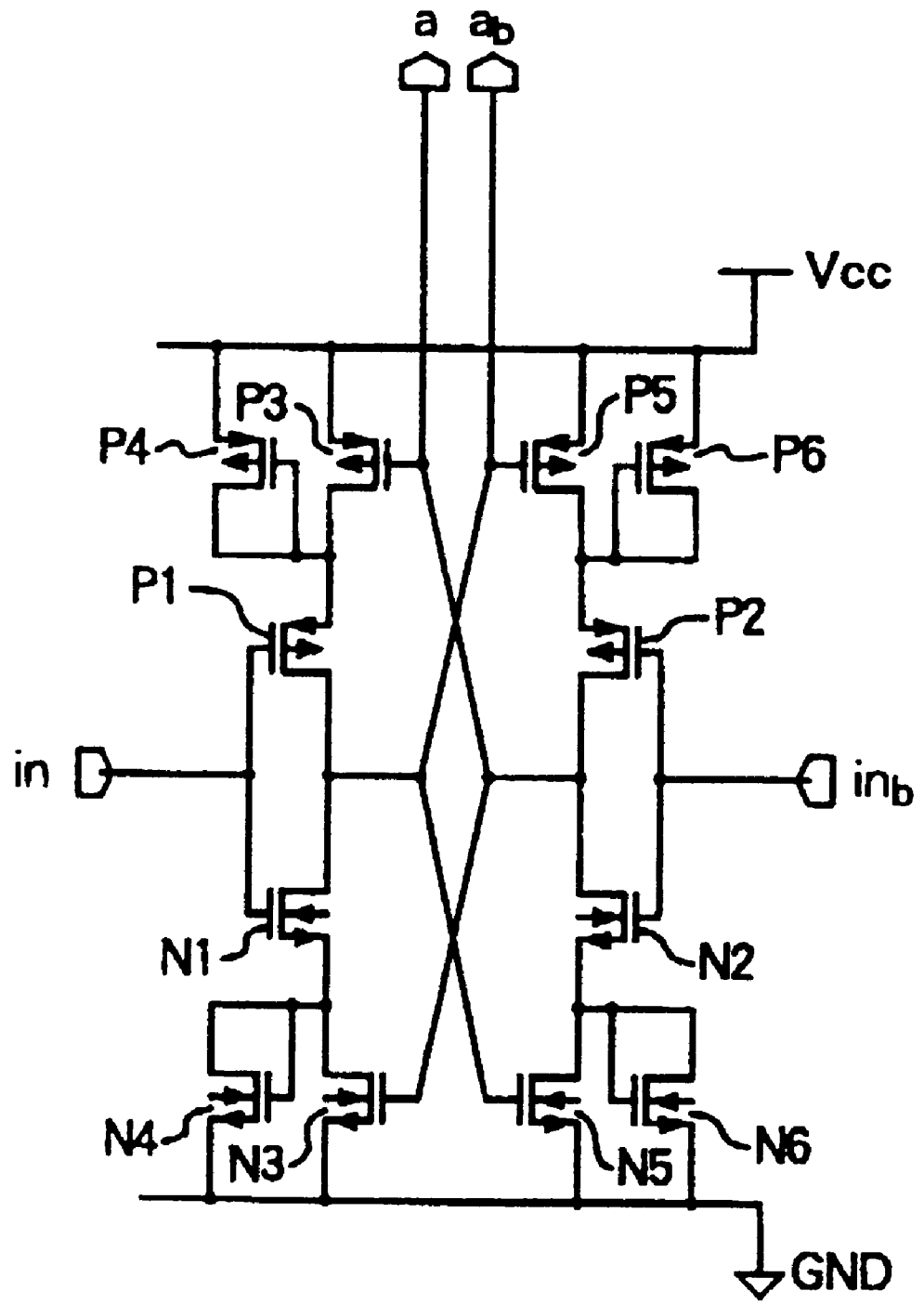
FIG. 4 is a circuit diagram illustrating the construction of a third embodiment of the level converter according to the present invention.

FIG. 4 is a circuit diagram illustrating a third embodiment of the level converter according to the present invention. In this third embodiment, a plurality of p-channel MOS transistors P4–P6, as well as the plurality of n-channel MOS transistors N4–N6, are used in place of the plurality of diodes D3–D6 in FIG. 1. The basic operation of this circuit is similar to the first and second embodiments of the present invention shown in FIGS. 1 and 2. Accordingly, the explanation of the circuit operation of this third embodiment is omitted.

Furthermore, it is possible to appropriately replace the plurality of diodes D3–D6 in the first embodiment by a plurality of bypass circuits having directionality.

According to the level converters of the present invention, as explained above, by arranging elements pertaining to the same bypass circuit corresponding to the construction of the preceding circuit stage, it is possible to improve the characteristics corresponding to the temperature characteristics and other circuit characteristics of the preceding circuit stage.

Figure 5:
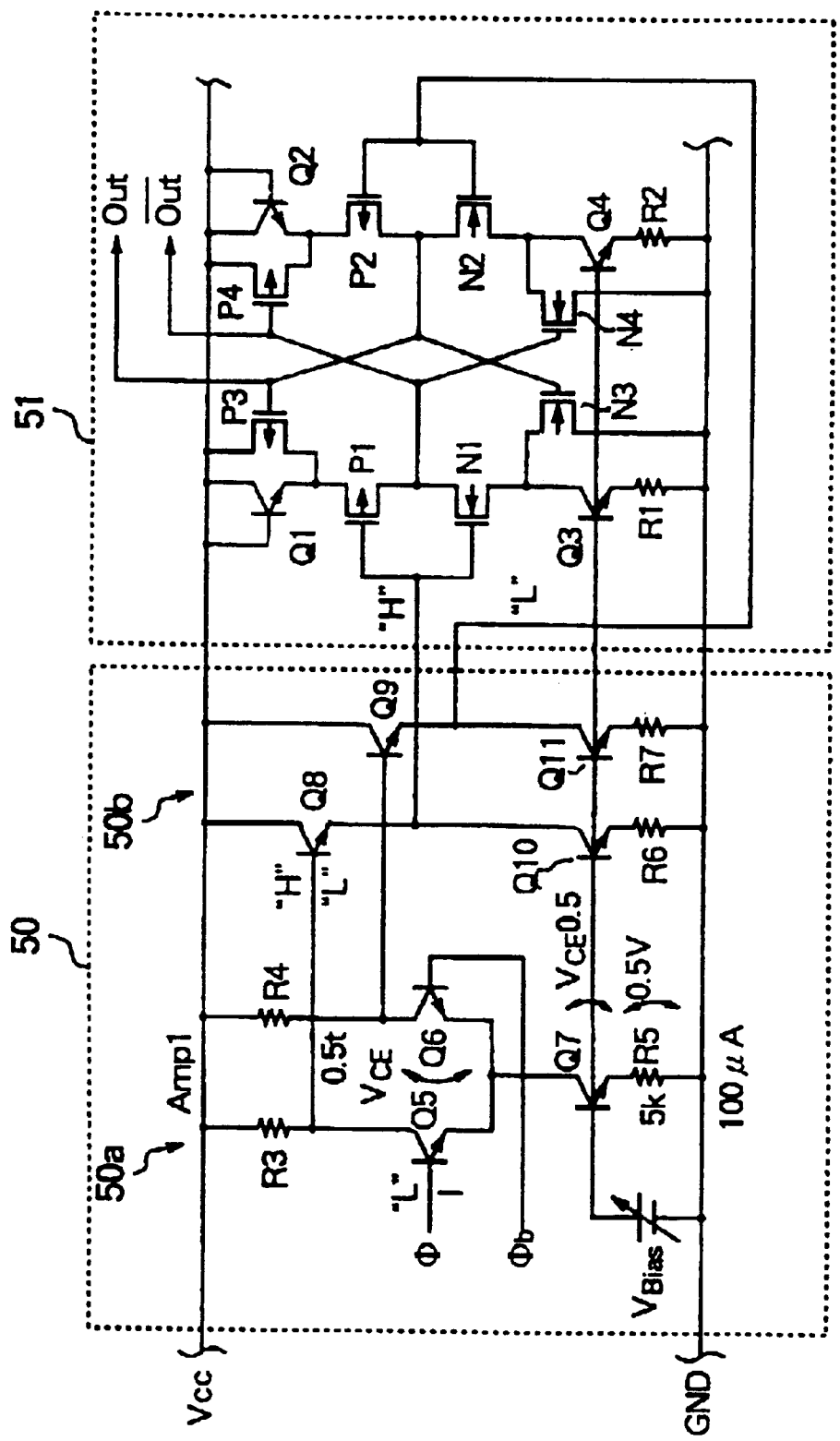
FIG. 5 is a circuit diagram for illustrating the combined construction of the level converter and a preceding circuit according to the present invention.
Figure 6:
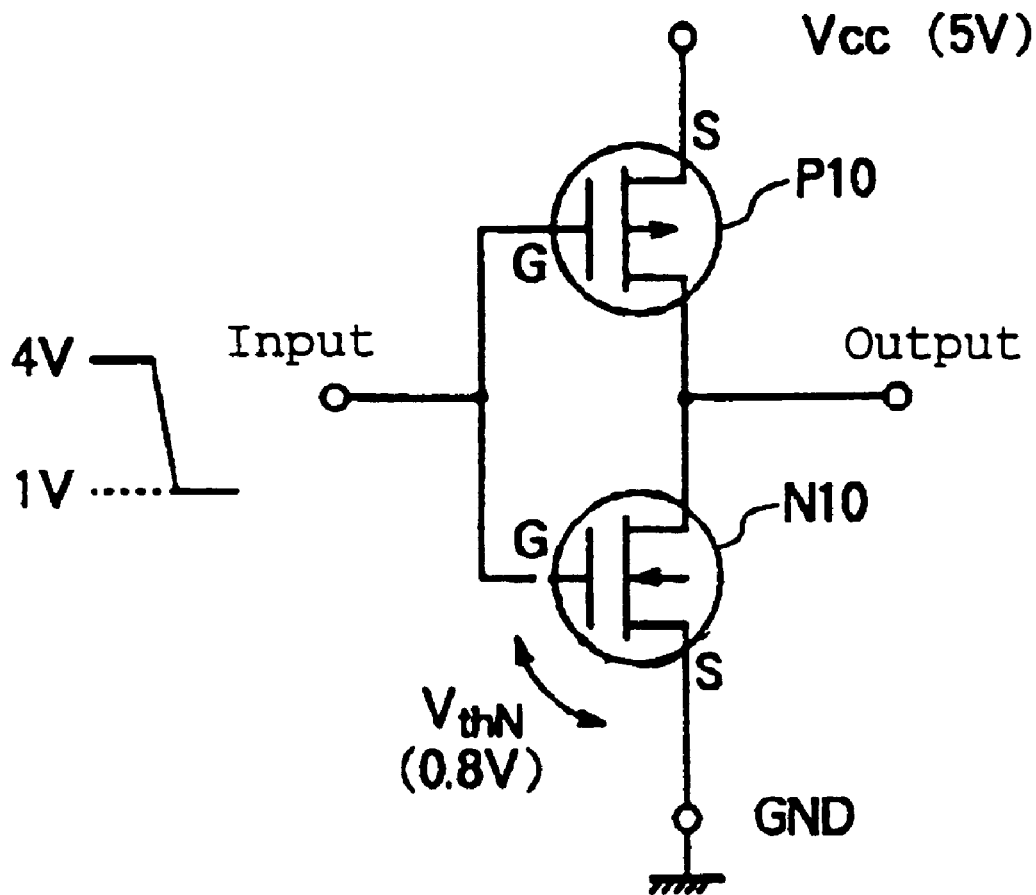
FIG. 6 is a circuit diagram illustrating a CMOS inverter.
Figure 7:
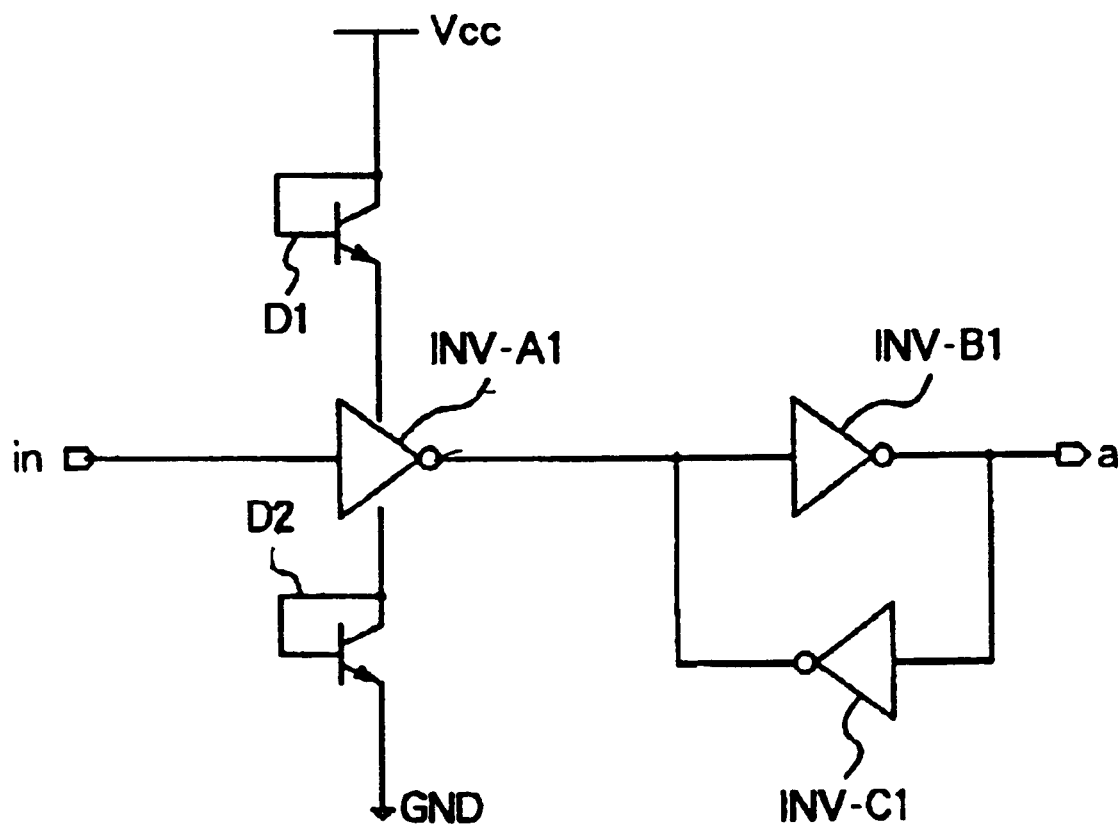
FIG. 7 is a circuit diagram illustrating a conventional level converter.
Figure 8:
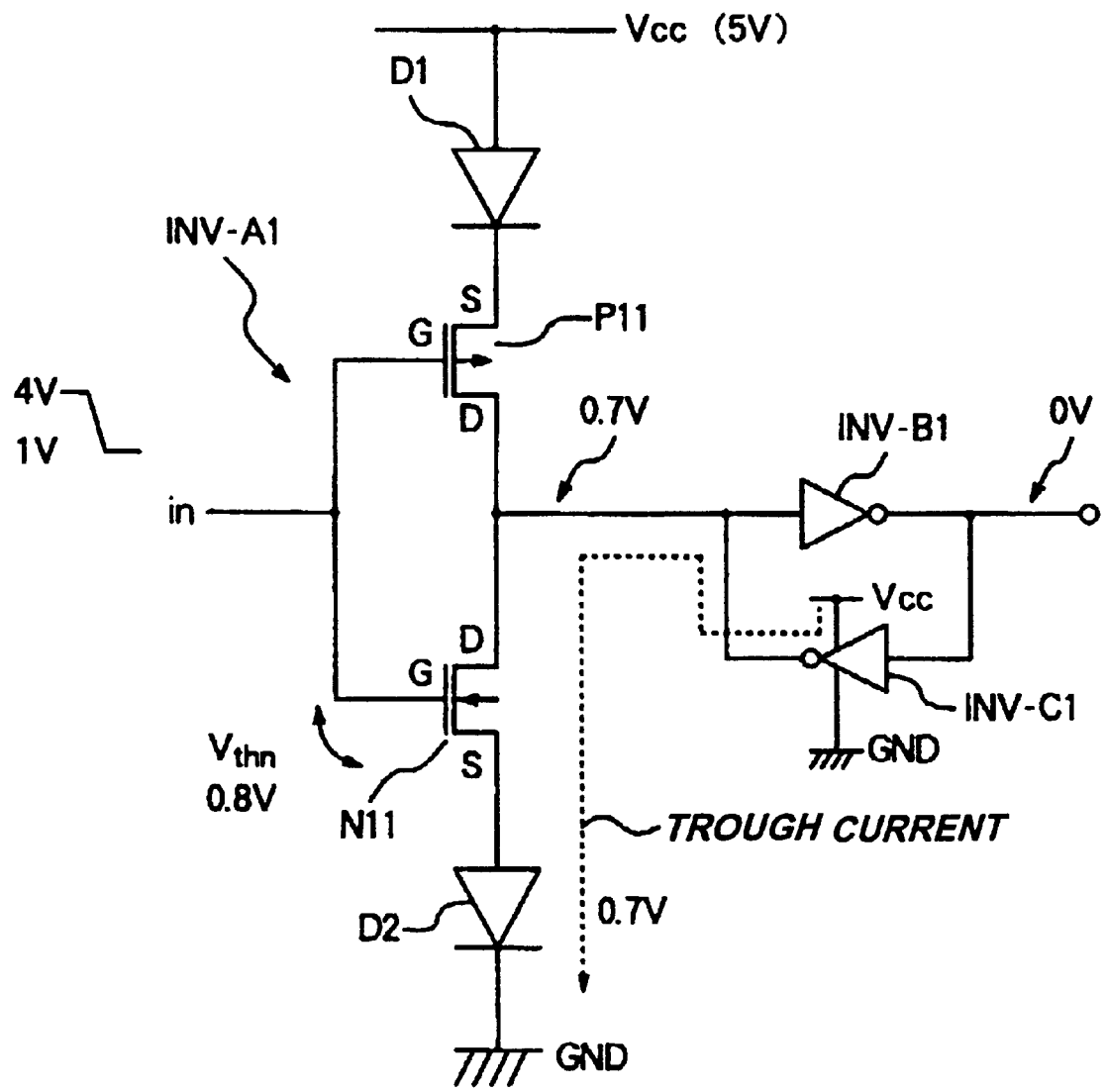
FIG. 8 is a diagram illustrating the operation of the conventional level converter.
Figure 9A:
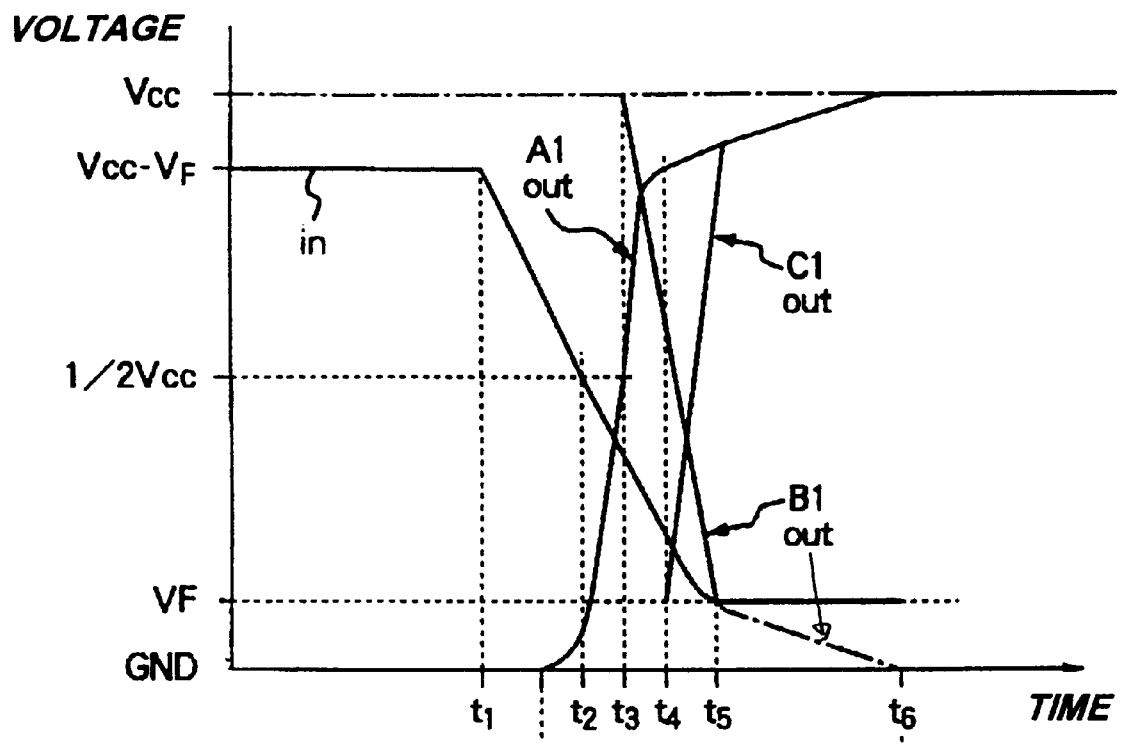
FIG. 9 is a diagram illustrating the operation during a level transition.
Figure 9B:
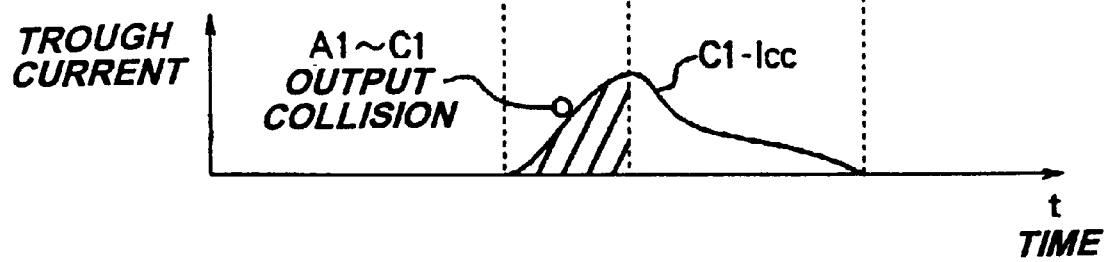

FIG. 5 is a combined circuit diagram illustrating the construction of the preceding circuit stage and the level converter according to the present invention. The circuit in FIG. 5 includes a preceding circuit stage (50) and a level converter (51). The preceding circuit stage (50) contains, for example, an ECL amplitude circuit (50a) and an amplitude amplifier (50b).

The ECL amplitude circuit (50a) includes a plurality of transistors Q1–Q3, a plurality of resistors R1–R3, and a bias voltage VBias. The amplitude amplifier (50b) includes a plurality of transistors Q4–Q7 and a plurality of resistors R4 and R5.

The construction of the level converter (51) adopts the circuit construction of the above-mentioned second preferable embodiment by using a plurality of bipolar transistors as the bypass circuit having a directionality which corresponds to the circuit elements of preceding circuit stage (50).

A non-inverted signal φ and a non-inverted signal φb are input into the ECL amplitude circuit (50a). For example, suppose that the high level is transmitted at 1.5 V, and the low level is transmitted at 1 V. For the output of amplifier Amp1, as the transistor Q5 is in an OFF state, the high level is at a high potential. The output of the transistor Q8 has an emitter-follower configuration, and its output is connected to the constant-current circuit of the transistor Q10 and the MOS gates of the MOS transistors P1 and P2.

Consequently, if the collector current Ic of the transistor Q8 is much larger (i.e., >>) than the collector current Ic of the transistor Q10, as the impedance of the gate of the MOS is infinite, Vcc-Q8 (VBE) (0.7 V)=approximately 4.3 V. Here, Q8 (VBE) refers to the base-emitter voltage of transistor Q8.

On the other hand, the transistor Q6 is in an ON state, and due to its output, the potential of the transistor Q9 falls. If the current flowing through the transistor Q7 as a constant-current circuit is Q7(Ic), the level of the potential becomes, Q7 (Ic)×R5+Q7 (VCE)+Q6 (VCE). Here, Q7(VCE) represents the collector-emitter voltage of transistor Q7, and Q6(VCE) represents the collector-emitter voltage of transistor Q6.

Usually, in this case, the current flowing is present such that the transistors Q6 and Q7 do not enter the saturated operation region. Specifically, VCE may be 0.5 V or higher. If Ic=100 mA, R3=5 kΩ, the emitter of transistor Q7 is 0.5 V, and with the value of VCE of the transistors Q6 and Q7, the output low level of transistor Q6 is approximately 1.5 V.

For the above case, in the output of amplitude amplifier (50b), the amplitude is amplified to a value of 4.3–1.5 V.

Here, the amplitude input to level circuit (51) shown in FIG. 5 is not a complete CMOS level; the amplitude makes delicate vibrations due to preceding circuit stage (50) and/or the variation in the temperature characteristics of the elements in the preceding circuit stage (50). However, by arranging the transistors Q1, Q3 and a resistor R1 as elements that cancel gate-source voltages VGS of the MOS transistors P1 and P2, and by using the same types of circuits and elements that determine the output amplitude of the preceding circuit stage, it is possible to compensate and provide a stable operation that can be performed free of influence of the variation in manufacturing of an IC and fluctuation in temperature.

In the circuit shown in FIG. 5, each element is constructed so as to have the following pair of conditions.

Transistor Q1=Transistor Q8;
Transistor Q2=Transistor Q9;
Transistor Q3+Resistor R1=Transistor Q10+Resistor R6; and
Transistor Q4+Resistor R2=Transistor Q11+Resistor R7.

The construction of the preceding circuit stage (50) may have various types corresponding to different circuits and operation points. For the circuit construction including pairs of elements, it is possible to construct the circuit so as to correspond to an appropriate bypass circuit with directionality.

The level converter according to the present invention may be also constructed by adopting appropriate opposite channel MOS transistors as a p-channel MOS transistor and an n-channel MOS transistor.

As explained above, the level converter according to the present invention can reduce the power consumption caused by the wasteful current due to the pass through mode in a conventional positive feedback circuit. Furthermore, it is possible to perform a prompt switching operation.

Also, by adopting a complementary construction of the two inverters, it is possible to perform a stable operation with respect to the variation in the characteristics due to variation in the device.

Furthermore, it is possible to convert an insufficient amplitude level for an input signal that cannot reach a prescribed level of an internal power source voltage, such as ETL level, and TTL level to an appropriate CMOS transistor output level. In addition, for the preceding elements that clip the CMOS transistor level, such as a source/follower made of a NPN transistor, the amplitude of the output varies due to the temperature characteristics of the base-emitter voltage VBE. In this case, by simply arranging the same element for compressing gate-source voltage VGS on the input side of the level converter according to the present invention, the influence of the aforementioned varying characteristics can be eliminated.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A level converter, comprising:
   a first inverter which provides an inverted output signal from a non-inverted input signal;
   a second inverter which provides a non-inverted output signal from an inverted input signal;
   a first gate unit coupled in series to the first inverter between a power source and a ground potential, the first gate is controlled by the output of the second inverter;
   a first directional bypass unit coupled in series to the first inverter between the power source and the ground potential for bypassing the first gate unit;
   a second gate unit coupled in series to the second inverter between the power source and the ground potential, the second gate is controlled by the output of the first inverter; and
   a second directional bypass unit coupled in series to the second inverter between the power source and the ground potential for bypassing the second gate unit.

2. The level converter according to claim 1, wherein each of the first and second directional bypass units includes a plurality of diodes.

3. The level converter according to claim 1, wherein each of the first and second directional bypass units includes a plurality of bipolar transistors.

4. The level converter according to claim 1, wherein each of the first and second directional bypass units includes a plurality of MOS transistors.

5. A level converter, comprising:
   a first inverter which provides an inverted output signal from a non-inverted input signal, the first inverter including a first CMOS transistor having a first p-channel MOS transistor and a first n-channel MOS transistor;

a second inverter which provides a non-inverted output signal from an inverted input signal, the second inverter including a second CMOS transistor having a second p-channel MOS transistor and a second n-channel MOS transistor;

a first gate unit including a third p-channel MOS transistor coupled in series with the first p-channel MOS transistor and a third n-channel MOS transistor coupled in series with the first n-channel MOS transistor, the first gate unit is controlled by an output signal from the second inverter;

a first directional bypass unit having first and second directional elements which provide a directionality of the first directional bypass unit, each of the first and the second directional elements is coupled in parallel to the third p-channel MOS transistor and to the third n-channel MOS transistor, respectively;

a second gate unit including a fourth p-channel MOS transistor coupled in series with the first p-channel MOS transistor and a fourth n-channel MOS transistor coupled in series with the first n-channel MOS transistor, the second gate unit is controlled by an output signal from the first inverter; and a second directional bypass unit having a third and a fourth directional elements which provide a directionality of the second directional bypass unit, each of the third and the fourth directional elements is coupled in parallel to the fourth p-channel MOS transistor and to the fourth n-channel MOS transistor, respectively.

6. The level converter according to claim 5, wherein each of the first and second directional bypass units includes a plurality of diodes corresponding to an output section of a preceding circuit stage.

7. The level converter according to claim 5, wherein each of the first and second directional bypass units includes a plurality of bipolar transistors corresponding to an output section of a preceding circuit stage.

8. The level converter according to claim 5, wherein each of the first and second directional bypass units includes a plurality of MOS transistors corresponding to an output section of a preceding circuit stage.

9. A level converter, comprising:

a first inverter means for inverting a non-inverted input signal to an inverted output signal;

a second inverter means for inverting an inverted input signal to a non-inverted output signal;

a first gate means coupled in series with said first inverter means for producing one of an ON and OFF state, said first gate means being controlled by an output of said second inverter means;

a first directional bypass means coupled in series with said first inverter means for bypassing said first gate means;

a second gate means coupled in series with said second inverter means for producing one of an ON and OFF state, said second gate means being controlled by an output of said first inverter means; and a second directional bypass means coupled in series with said second inverter means for bypassing said second gate means.

10. The level converter according to claim 9, wherein said first and second directional bypass means includes a plurality of diodes.

11. The level converter according to claim 9, wherein said first and second directional bypass means includes a plurality of bipolar transistors.

12. The level converter according to claim 9, wherein said first and second directional bypass means includes a plurality of MOS transistors.

13. The level converter according to claim 9, wherein said first inverter means includes a CMOS transistor having a p-channel MOS transistor and an n-channel MOS transistor.

14. The level converter according to claim 9, wherein said second inverter means includes a CMOS transistor having a p-channel MOS transistor and an n-channel MOS transistor.

15. The level converter according to claim 9, wherein said first gate means includes a p-channel MOS transistor and an n-channel MOS transistor.

16. The level converter according to claim 9, wherein said second gate means includes a p-channel MOS transistor and an n-channel MOS transistor.

17. The level converter according to claim 15, wherein said first directional bypass means includes a first and second directional element coupled in parallel to said p-channel MOS transistor and said n-channel MOS transistor, respectively.

18. The level converter according to claim 16, wherein said second directional bypass means includes a first and second directional element coupled in parallel to said p-channel MOS transistor and said n-channel MOS transistor, respectively.

* * * * *